US010068893B2

(12) United States Patent
Schneider et al.

(10) Patent No.: US 10,068,893 B2
(45) Date of Patent: Sep. 4, 2018

(54) DIODE-BASED ESD CONCEPT FOR DEMOS PROTECTION

(71) Applicant: Infineon Technologies AG, Neubiburg (DE)

(72) Inventors: Jens Schneider, Munich (DE); Klaus Roeschlau, Grafing b. Munich (DE); Harald Gossner, Riemerling (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 356 days.

(21) Appl. No.: 14/725,800

(22) Filed: May 29, 2015

(65) Prior Publication Data
US 2015/0262993 A1    Sep. 17, 2015

Related U.S. Application Data

(63) Continuation of application No. 11/844,965, filed on Aug. 24, 2007, now Pat. No. 9,048,096.

(51) Int. Cl.
*H01L 23/62* (2006.01)
*H01L 27/02* (2006.01)
*H01L 29/06* (2006.01)
*H01L 29/08* (2006.01)
*H01L 29/10* (2006.01)
*H01L 29/732* (2006.01)
(Continued)

(52) U.S. Cl.
CPC ...... *H01L 27/0259* (2013.01); *H01L 27/0255* (2013.01); *H01L 29/0684* (2013.01); *H01L 29/0804* (2013.01); *H01L 29/0821* (2013.01); *H01L 29/1004* (2013.01); *H01L 29/732* (2013.01); *H01L 29/7833* (2013.01); *H02H 9/041* (2013.01)

(58) Field of Classification Search
CPC .................................................. H01L 27/0259
USPC ........................................................ 257/362
See application file for complete search history.

(56) References Cited

U.S. PATENT DOCUMENTS 5,521,783 A    5/1996  Wolfe et al.
5,751,525 A    5/1998  Olney
(Continued)

OTHER PUBLICATIONS

Ghosh, K.K., et al., "A High Voltage CMOS ADSL Line Driver," ISPSD 2003, IEEE 15th International Symposium on Power Semiconductor Devices and ICs, Apr. 14, 2003, pp. 105-108.
(Continued)

*Primary Examiner* — Hsin-Yi Hsieh
(74) *Attorney, Agent, or Firm* — Slater Matsil, LLP

(57) ABSTRACT

The invention relates to an ESD protection circuit for an integrated circuit including a drain-extended MOS device and an output pad that requires protection. The ESD protection circuit includes a first diode coupled to the output pad and to a bias voltage rail, a second diode coupled to the output pad and to another bias voltage rail, and an ESD power clamp coupled between the two bias voltage rails. The ESD power clamp is formed as a vertical npn transistor with its base and emitter coupled together. The collector of the npn transistor is formed using an n-well implantation and a DEMOS n-drain extension to produce a snapback-based voltage limiting characteristic. The diodes are formed with a lightly p-doped substrate region over a buried n-type layer, and a p-well implant and an n-well implant separated by intervening substrate. A third diode may be coupled between the two bias voltage rails.

16 Claims, 6 Drawing Sheets

(51) Int. Cl.
 *H01L 29/78* (2006.01)
 *H02H 9/04* (2006.01)

(56) References Cited

U.S. PATENT DOCUMENTS

| | | |
|---|---|---|
| 6,051,457 A | 4/2000 | Ito |
| 6,064,249 A | 5/2000 | Duvvury et al. |
| 6,066,879 A | 5/2000 | Lee et al. |
| 6,365,940 B1 | 4/2002 | Duvvury et al. |
| 6,624,487 B1 | 9/2003 | Kunz et al. |
| 6,756,642 B2 | 6/2004 | Lee et al. |
| 6,804,095 B2 | 10/2004 | Kunz et al. |
| 7,659,558 B1 | 2/2010 | Walker et al. |
| 2007/0194380 A1 | 8/2007 | Okushima |
| 2007/0195472 A1 | 8/2007 | Kwak et al. |
| 2008/0237782 A1 | 10/2008 | Williams et al. |

OTHER PUBLICATIONS

Stephens, R., "Active Output Impedance for ADSL Line Drivers," Texas Instruments Incorporated, Analog Applications Journal, 4Q, Apr. 2002, pp. 24-31.

DIODE-BASED ESD CONCEPT FOR DEMOS PROTECTION

This is a continuation application of U.S. application Ser. No. 11/844,965, entitled "Diode-Based ESD Concept for DEMOS Protection," filed on Aug. 24, 2007, which application is hereby incorporated herein by reference in its entirety.

TECHNICAL FIELD

An embodiment of the invention relates generally to integrated circuits, semiconductor devices, and methods, and more particularly to an ESD protection device and method of protecting an integrated circuit against electrostatic discharge.

BACKGROUND

As electronic components and the internal structures in integrated circuits continue to become smaller, it has become easier to either completely destroy or otherwise impair electronic components. In particular, many integrated circuits are highly susceptible to damage from the unintended discharge of static electricity, generally as a result of handling or from physical contact with another charged body. Electrostatic discharge (ESD) is the transfer of an electric charge between bodies at different electrostatic potentials (voltages), caused by direct contact, or induced by an electrostatic field. The discharge of static electricity has become a critical problem for the electronics industry.

Device failures that result from ESD events are not always immediately catastrophic or apparent. Often, the device is only slightly weakened but is less able to withstand normal operating stresses and, hence, may result in a reliability problem. Therefore, various ESD protection circuits should be included in the device to protect the various components.

When an ESD discharge occurs onto a transistor or other semiconductor element, the high voltage and current of the ESD pulse relative to the voltage- and current-sustaining capabilities of structures within the device can break down the transistor and potentially cause permanent or latent damage. Consequently, circuits associated with input/output pads of an integrated circuit need to be protected from ESD pulses so that they are not damaged by such discharges.

Integrated circuits and the supporting device geometries which form the integrated circuits continue to be reduced in size. The physical dimensions of transistor structures limit the voltage that the transistor can withstand without damage. Thus, as semiconductor devices are formed with fine-line structures, breakdown voltages of transistors therein and other circuit elements are lowered, and currents capable of overheating components are more frequently reached by the voltages and currents induced by an ESD event. Additionally, recent advances in technology have produced devices which can fail at voltage levels lower than the triggering voltages of known ESD protection circuits. As an example, modern CMOS processes, particularly fine-line processes including lightly doped drain extension structures, are required to support low-voltage designs such as circuits that operate with bias voltages of 1.5 volt or lower, and also support higher voltage capabilities, such as analog and mixed signal outputs at voltages such as 12 volts. This allows design of highly integrated products with both digital and analog mixed-signal functionalities, for example, line drivers in a telecommunications device. Such designs present a narrow window of voltage in which ESD protection must be provided. A voltage clamping device is required for an ESD event wherein a clamping voltage is lower than a breakdown voltage of protected circuit parts, such as a drain-extended MOS (DEMOS) driver stage in a telecommunications device that may require protection with a clamping voltage between 15 and 22 volts, for example, for a 12-volt rated device.

In conventional technologies, fine-line products (e.g., products constructed with a 130 nm or finer technology) with high voltage CMOS protection requirements above 10 volts have either been implemented in older technologies with larger feature sizes (e.g., with a 250 nm or larger technology) with appropriately higher breakdown voltages, or have been realized with a system-in-package (SIP) approach wherein a low voltage part is implemented in an advanced technology (e.g., in a 130 nm technology), and the high voltage part in a 250 nm, or even a 0.35 µm, technology. Both solutions suffer from cost disadvantages.

Thus, there is a need for small, compact, ESD protection circuits capable of economically protecting low-voltage circuits that include high voltage capability.

SUMMARY OF THE INVENTION

In accordance with one exemplary embodiment of the invention, an integrated circuit is provided. The integrated circuit includes a drain-extended MOS device. The integrated circuit further includes an output pad that requires ESD protection and first and second bias voltage supply rails. The integrated circuit further includes an ESD protection circuit including a first ESD diode coupled to an output pad and to the first bias voltage supply rail, a second ESD diode coupled to the output pad and to the second bias voltage supply rail, and an ESD power clamp coupled between the first and second bias voltage supply rails. In accordance with an exemplary embodiment, the ESD power clamp comprises a bipolar transistor, wherein a base and emitter thereof are coupled together. In an exemplary embodiment, the bipolar transistor is an npn transistor, wherein a collector of the npn transistor comprises an n-well implantation and a DEMOS n-drain extension. In an exemplary embodiment, the ESD power clamp is constructed to produce a snapback-based voltage-limiting characteristic. In an exemplary embodiment, the ESD diodes comprise a lightly p-doped substrate region over a buried n-type layer, and a p-well implant and an n-well implant separated by an intervening substrate region to provide high blocking voltage capability.

The term "ESD diode" is used herein to refer both to an ordinary diode with sufficient voltage-blocking capability for an intended application as well as a more complex diode structure with a snapback-based voltage-limiting characteristic, such as an npn transistor formed as described herein.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views. For a more complete understanding of the invention, reference is now made to the following descriptions taken in conjunction with the accompanying drawings, in which:

DETAILED DESCRIPTION OF ILLUSTRATIVE EMBODIMENTS

Figure 1:
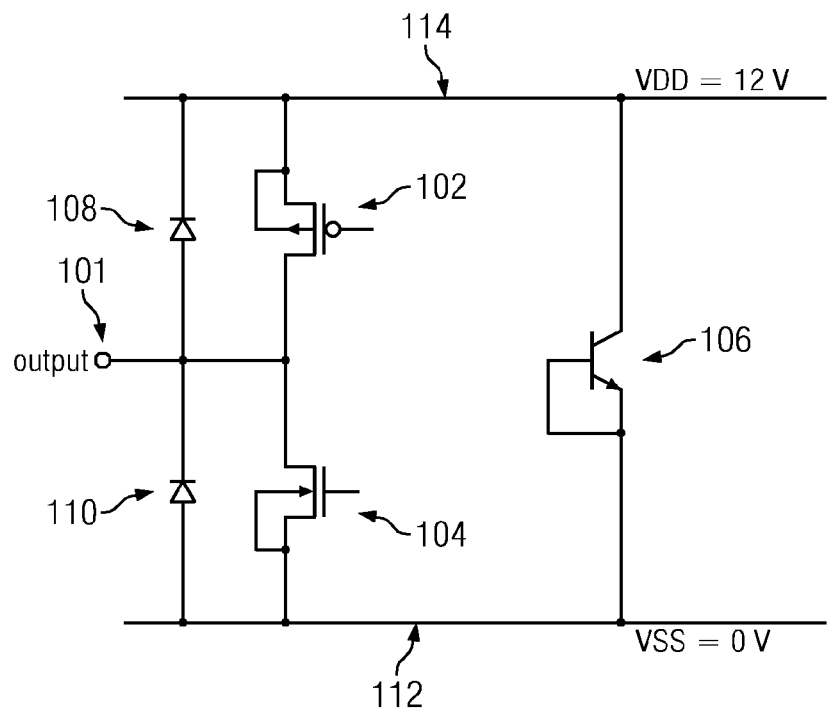
FIG. 1 illustrates a an ESD protection circuit for a DEMOS device, formed with ESD diodes coupled to an output pad to be protected and an ESD power clamping device coupled to bias voltage supply rails, constructed according to an exemplary embodiment of the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an ESD protection arrangement including ESD diodes and a power-clamping device for an integrated circuit formed with DEMOS (drain-extended MOS) elements. The invention may also be applied, however, to other semiconductor structures, and is not limited to this particular implementation, such as a DEMOS integrated circuit. Other integrated circuits can be protected from ESD discharges in different contexts using inventive concepts described herein.

An ideal ESD protection structure for a device terminal to be protected, such as an output pin, should turn on very quickly relative to the timeframe of an ESD discharge, conduct the substantial currents associated with the ESD discharge, such as 1 ampere or more for 100 ns, not require a large amount of device area for its implementation, and not load the protected terminal with substantial resistance or capacitance. In addition, any added protection structure should not require additional processing steps during device manufacture, such as an additional masking step, which would increase device cost. Ideally, no additional processing step would be required.

DEMOS devices are field-effect devices formed with relatively lightly doped drain and sometimes also source regions adjacent to a gate. The lightly doped drain and source regions provide a substantially higher drain-to-source operating voltage than a device formed with conventional drain and source doping densities. Thinner gate oxides can also be used in these devices in view of a reduced electric field that is produced in the vicinity of the gate. Such designs are particularly useful in fine-line devices when portions of these are required to operate at a higher voltage than is normally supported by the fine-line feature size. A lightly doped region adjacent a collector in a bipolar device can also be used to produce a higher internal breakdown voltage.

Continuing feature-size reductions also alter the ability of integrated ESD protection structures to provide a necessarily higher level of protection required by the smaller, more fragile device structures. For example, the gate dielectric thickness of semiconductor devices formed with a feature size less than 100 nm is on the order of only several nanometers. A 10-volt pulse applied to such a gate generates an internal electric field approaching $10^{10}$ volts per meter, which is substantially greater than the breakdown voltage of any ordinary gate dielectric.

To circumvent cost issues when incorporating ESD protection in a DEMOS device, technology add-ons based on such DEMOS devices have previously been employed. These devices can withstand and work at voltages above 10 volts, but require process add-ons, i.e., a need for additional mask layers is required. Since DEMOS devices now represent a new device class, there are few ESD protection approaches at hand to protect such advanced technology circuits against ESD pulses at supply and at I/O pins of the device based on this new technology variant. Known solutions include substrate-pumped DEMOS, as described by Kunz, Keith E., et al., in U.S. Pat. Nos. 6,804,095 and 6,624,487, and DEMOS-based SCRs, (silicon controlled rectifiers) as described by Lee, et al., in U.S. Pat. Nos. 6,066,879 and 6,756,642, and by Duvvury, et al., in U.S. Pat. No. 6,365,940, which four documents are hereby incorporated herein by reference.

Both approaches attempt to increase the inherently poor ESD capabilities of DEMOS devices by adding additional structures in the direct vicinity of a DEMOS transistor. This either leads to an SCR formed by the DEMOS device itself, with the additional implantations and other manufacturing processes that are required therefor, as described by Lee and by Duvvury, or else a second DEMOS device is used as an auxiliary device, as described by Kunz, to operate the main DEMOS device in a bipolar mode where it can carry higher amounts of current.

The DEMOS-based SCR described by Lee and by Duvvury is intrinsically subject to the dangers of latch-up due to a low holding voltage. This issue is especially critical for DEMOS devices that operate from a high supply voltage, such as 12 volts.

A substrate-pumped DEMOS acting as ESD clamp, as described by Kunz, relies on transients that can lead to improper triggering, thereby leading either to operational failures or failure to trigger for a weak ESD event. In addition, such substrate-pumped approaches are very area-consuming on a semiconductor die, and are therefore expensive.

Both device protection approaches are limited in the maximum voltage they can protect due to thin gate oxides attached to a high voltage drain region of the protected device.

In an embodiment of the invention, a new ESD protection approach is introduced for a DEMOS-based device. In one embodiment, the device includes a DEMOS-based driver circuit. The new approach is applicable, without limitation, to other DEMOS-based circuit implementations. The new approach can be implemented employing process steps already present in a DEMOS-based manufacturing line without the need for new processing steps to accommodate the ESD protection elements.

To operate high-voltage DEMOS devices at supply voltages of 10 volts or higher with fine-line structures, such as 130 nm, special process steps are typically required to be integrated into a standard advanced CMOS process, perhaps three or more added photo-lithographic masks, and by respective ion implantation steps. Two of these steps are typically required to create special drain extension regions for the DEMOS devices; a third step typically provides an isolation layer for a DE-PMOS (drain extended PMOS) to a p-substrate. These new process steps for DEMOS devices are generally accompanied by appropriately adjusted layout rules for p-well/n-well separation distances, as is well-known in the art, because the standard CMOS well-to-well breakdown voltage is generally too low for device operation at or above 10 volts.

Turning now to FIG. 1, an exemplary embodiment of the invention for ESD protection is illustrated. The embodiment comprises added ESD diodes, 108 and 110, with sufficiently high reverse breakdown voltage, connected between an I/O pad to be protected and bias voltage supply rails of the device (parallel to the drivers), and a highly efficient ESD power clamp, 106, constructed, in a preferred embodiment, as a vertical npn transistor (i.e., a bipolar device without a gate oxide) coupled between the bias voltage supply rails 112 and 114. The vertical npn transistor includes a special n-drain extension ordinarily included in DENMOS (drain-extended NMOS). The added diodes clamp the I/O pad to be protected to the upper and lower bias voltage supply rails of the device, relying on the limited forward voltage drop of these diodes and the rapid forward voltage recovery time of such fine-line devices. These added ESD diodes do not break down in a reverse direction, neither during ordinary operation of the circuit nor during an ESD event. The vertical npn ESD power clamp provides a stiff snapback clamping voltage between the two supply rails of the device to limit a maximum clamping voltage that can be sustained between the two supply rails. Accordingly, the voltage that can be sustained by the I/O pad to be protected cannot substantially exceed the voltage of a bias voltage supply rail by more than the forward voltage drop of a diode, and the voltage between the bias voltage supply rails is limited by the maximum voltage that can be sustained across the ESD power clamp. The added ESD circuitry is dimensioned in a manner that the clamping voltage of the ESD power clamp prevents breakdown of DEMOS circuit elements at destructive currents or voltages.

An ordinary diode with a reverse breakdown voltage is not a good option to provide ESD protection for a DEMOS device because the soft voltage-clamping characteristic of such devices is generally insufficient to provide the necessary voltage clamping level for the large instantaneous currents that generally flow during an ESD event. The snapback-based voltage limiting characteristic of the ESD power clamp as described hereinbelow provides a level of voltage clamping protection that is not obtainable with an ordinary diode that might be substituted in its place.

Illustrated in FIG. 1 is an ESD protection circuit for an output pad 101 of a DEMOS device, constructed according to the principles of the invention. PMOS transistor 102 and NMOS transistor 104 form an exemplary DEMOS driver stage for output node 101, which may be required to sustain without damage a high operational voltage, such as 12 volts. Output pad 101 requires ESD protection, being an external node of the circuit. The ESD protection circuit comprises ESD diode 108, coupled between output pin 101 and VDD (i.e., higher voltage) supply rail 114, and ESD diode 110, coupled between output pad 101 and VSS (i.e., lower voltage) supply rail 112, representing, for example, local circuit ground. The ESD protection circuit further comprises ESD power clamp 106 formed with an npn bipolar transistor with its base coupled directly to its emitter. ESD diodes 108 and 110 are formed to sustain high reverse breakdown voltage. Power clamp 106 is formed with the special n-drain extension characteristic of a DENMOS device and is designed to clamp a voltage applied between its emitter and collector that is less than the breakdown voltage of ESD diodes 108 and 110.

ESD power clamp 106 can be scaled to high voltages and its breakdown voltage can be adjusted by design parameters of the implantation areas, employing techniques well known in the art. Reverse breakdown voltage of the diodes, forward bias voltage drop and clamping voltage of the power clamp can be adjusted to protect the breakdown voltage of the DEMOS driver stage. This is important, particularly if a positive ESD discharge at the output pad with respect to the VSS rail occurs. In this case, the protection path contains forward-biased ESD diode 108 in series with power clamp 106. The sum of the voltage drops across these devices has to be sufficiently low to avoid a breakdown of DENMOS transistor 104 at a destructive current level. The same reasoning can be applied to a negative ESD discharge with respect to the VDD supply rail where the forward-biased ESD diode 110 protects DEPMOS transistor 102.

Figure 2:
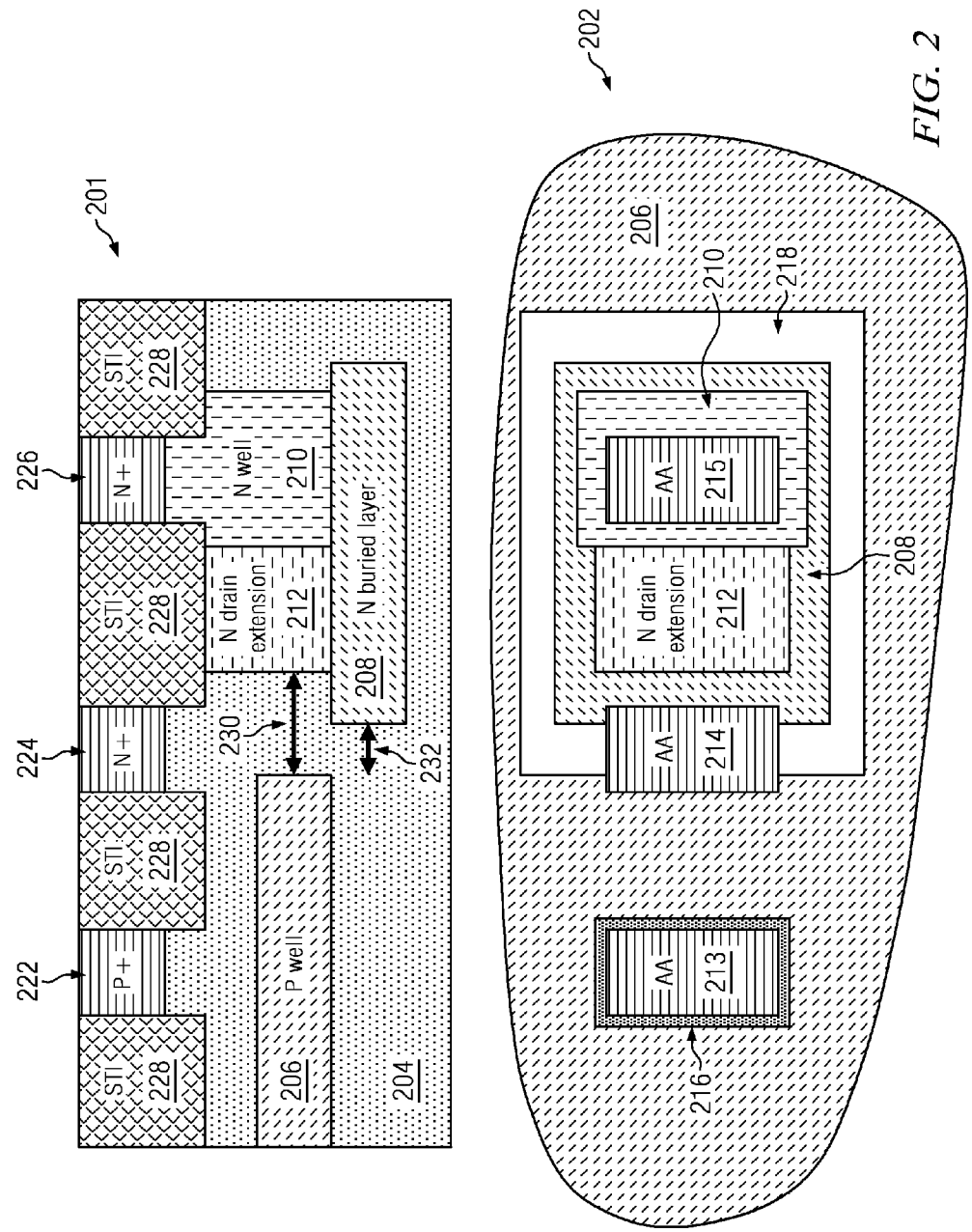
FIG. 2 illustrates elevation and plan views of an ESD power clamp, constructed according to an exemplary embodiment of the invention.

Turning now to FIG. 2, illustrated is an elevation of view, 201, and a plan view, 202, of an ESD power clamp, formed as a semi-vertical npn transistor, constructed in accordance with the principles of the invention. The power clamp is formed on a p-doped substrate 204. A p-well, 206, and an n-type buried layer, 208, are implanted in substrate 204. An n-well 210 and a lightly doped n-type drain extension 212 are formed above n-type buried layer 208. The lightly doped n-type drain extension 212 provides a higher breakdown voltage rating for the npn transistor. The n-well 210 and the drain extension 212 may overlap. The term "drain extension" is commonly used to describe a lightly doped region of a field-effect transistor, but has been carried over to bipolar devices because it serves the same high-voltage-rating purpose. A highly doped p+ region 222 forms a base contact area and highly doped n+ regions 224 and 226 form emitter and collector contact areas of the npn transistor, respectively. The emitter, base, and collector of the npn transistor are separated by shallow-trench isolations 228. The n-type drain extension 212 is preferably separated from p-well 206 by a distance of about 1-2 μm, illustrated in the figure with reference designation 230, to preserve a breakdown voltage of the device. The separation between p-well 206 and n-type buried layer 208, illustrated in the figure with reference designation 232, is substantially shorter; p-well 206 and n-type buried layer 208 can even overlap.

As illustrated in plan view 202 of the npn transistor forming the ESD power clamp, active area 213 is a highly doped p+ region formed in p-type implant 216. Active areas 214 and 215 are highly doped n+ regions that represent the emitter and collector of the npn transistor, respectively. Area 218 represents a region of the device in which no p-well is formed to provide the necessary device voltage rating. The bipolar transistor structure is shown formed in a p-well, 206.

The usual n+- and p+-diffusions of a CMOS process are used to create the three respective contact areas of the npn transistor (collector: n+, base: p+, emitter: n+), illustrated in FIG. 2 as active areas AA. The collector is then formed using a standard n-well implantation, a DEMOS-specific n-drain extension, and n-buried layer implantations as illustrated in FIG. 2. The base is formed using a standard CMOS p-well implantation over the p-substrate, which is preferably lightly doped. The p-substrate has typical doping levels of 1e14 to 1e16 cm^−3. The extension of the n-type buried layer from the collector area into the emitter/base region and the position of the p-well implant can be used to a certain extent, as is well understood in the art, to set the collector/base breakdown voltage, $V_{CBO}$.

The operation of the three-layer npn structure illustrated in FIG. 2, wherein a snapback voltage-current characteristic is produced, can be described as follows. During an ESD event, current flows into the collector, 226. If the current level is sufficiently high, the junction between the n-type buried layer 208 and the p-well 206 breaks down, allowing this current to flow out the base, 222. If the current into the collector increases sufficiently, further current flows out the base, producing a voltage drop between the n-type buried layer and the p+ base region. If this voltage drop across this junction is sufficiently high, then bipolar transistor action is initiated, diverting the main current flowing into the collector to the emitter, which is a low ohmic path. In this manner a snapback effect is produced at sufficiently high ESD current levels, resulting in a lower clamping voltage level than would be produced by a simple diode.

Figure 3:
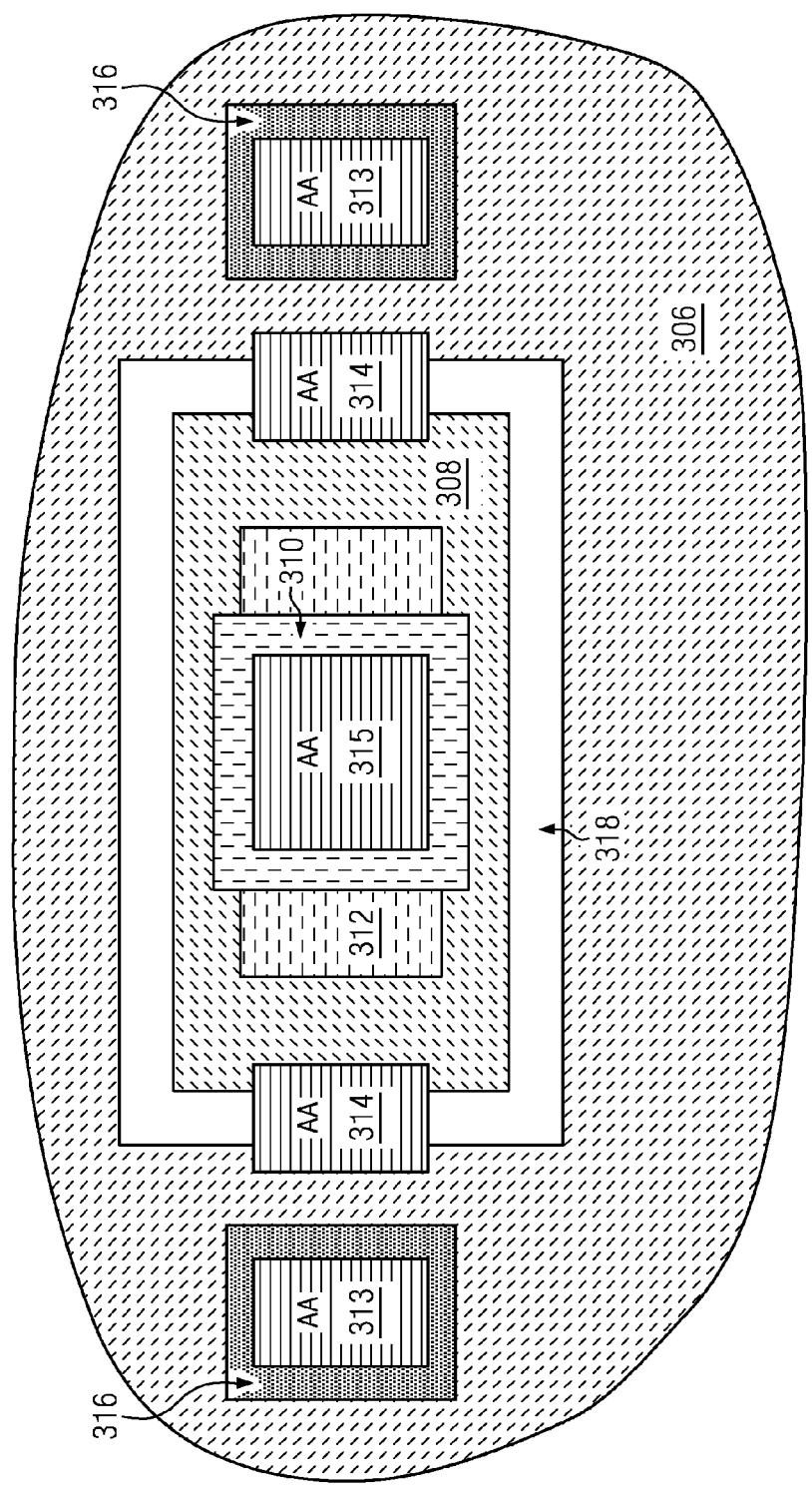
FIG. 3 illustrates an elevation and plan view of an ESD power clamp, constructed according to an exemplary embodiment of the invention.

Turning now to FIG. 3, illustrated is a plan view of another npn transistor formed as an ESD power clamp, constructed in accordance with a preferred embodiment of the invention. The power clamp is formed in a double finger stripe layout in which the single-finger structure shown in FIG. 2 is mirrored horizontally as illustrated in FIG. 3. Several such double fingers can be placed in parallel to sustain, without damage, the high currents that may occur during an ESD event.

The ESD power clamp illustrated in FIG. 3 is shown formed in a p-type well 306. An n-type buried layer, 308, is implanted in the substrate. Area 318 represents a region of the device surrounding the n-type buried layer 308 in which no p-well is formed. An n-well 310 and a lightly doped n-type drain extension 312 are formed above the n-type buried layer 308. A highly doped p+ region 313, illustrated as an active area AA, forms a base contact area, surrounded by p-type implant 316. Highly doped n+ regions 314 and 315, also illustrated as active areas AA, form emitter and collector contact areas of the npn transistor. The p+ region 313 can also be formed as ring around the emitter and collector area, with an appropriate separation distance to the regions 308, 310, 312, 314, and 315.

Another embodiment of an npn transistor used as an ESD power clamp comprises a square or rectangular ring-shaped layout in which emitter and collector rings are formed around a central base contact area. Again, such devices can be formed in parallel as necessary to sustain robustly the substantial currents associated with an ESD event. In a further embodiment, a base contact area can be formed as a ring surrounding an inner collector/emitter structure.

In a further embodiment of an npn transistor used as an ESD power clamp, the n-type buried layer can be omitted, and the protection device can be formed using standard CMOS implantations plus a DEMOS-specific n-type drain extension to provide the necessary operating voltage withstand capability.

Figure 4:
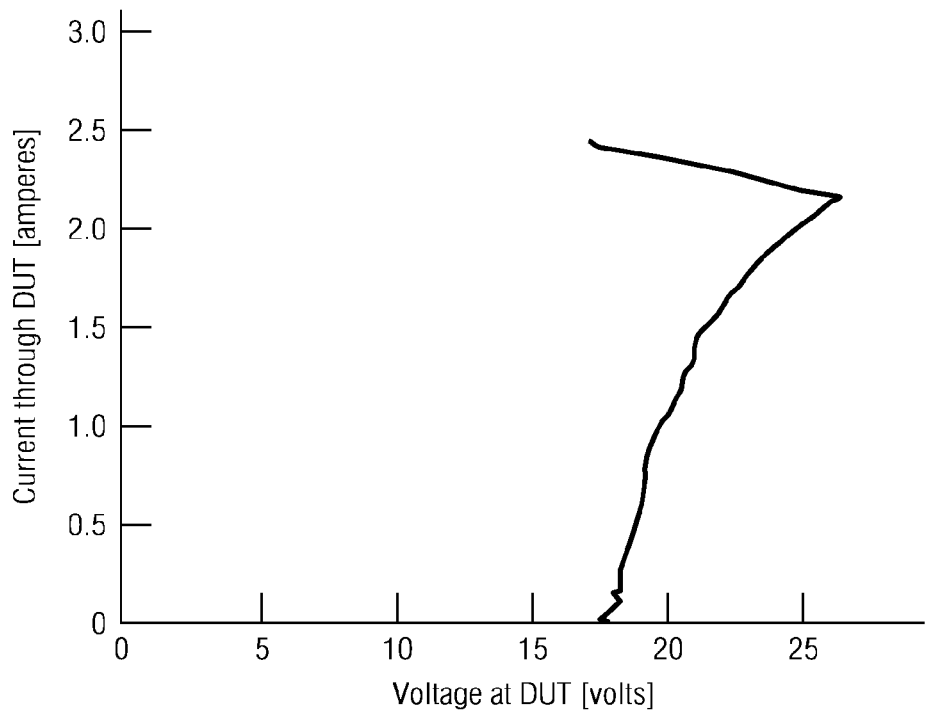
FIG. 4 illustrates a voltage-current characteristic curve for an ESD power clamping device obtained by pulsed measurements, constructed according to an exemplary embodiment of the invention.

An exemplary snapback-based voltage-limiting characteristic for an ESD power clamp, constructed according to the principles of the invention, is illustrated in FIG. 4. The voltage-limiting characteristic is obtained by pulsed measurements (transmission-line pulsing, TLP), as is well known in the art. The current applied to the device under test ("DUT") is shown on the vertical axis, and the resulting voltage sustained by the device is illustrated on the horizontal axis. The snapback-based voltage-limiting characteristic is apparent in the figure beginning at current levels well below 0.1 amperes. The large snapback around two amperes indicates destruction of the device. The snapback voltage-limiting characteristic is apparent beginning at current levels slightly greater than about two amperes.

Figure 5:
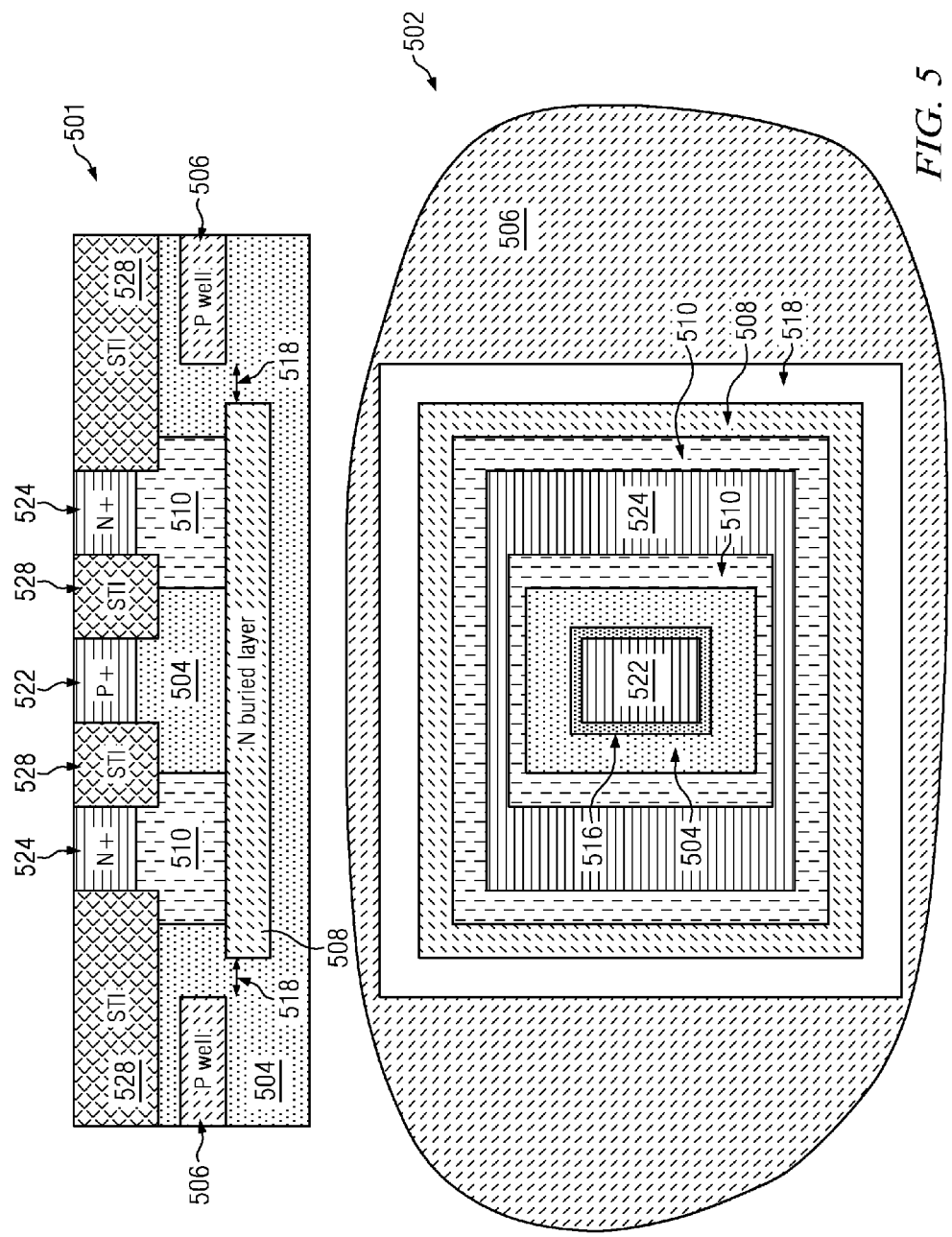
FIG. 5 illustrates elevation and plan views of an ESD diode, constructed according to an exemplary embodiment of the invention.

Turning now to FIG. 5, illustrated is an ESD diode formed to enable high voltage DEMOS ESD protection, such as ESD diodes 108 and 110 as illustrated in FIG. 1, constructed according to the principles of the invention. An elevation view of the ESD diode, 501, is illustrated in the upper portion of the figure, and a plan view, 502, is illustrated in the lower portion of the figure. The ESD diode can be formed using standard CMOS processing steps that do not necessarily need new, special, DEMOS process features. The anode 522 of the ESD protection diode can be realized with a standard, highly doped, CMOS p+ diffusion, as illustrated in the figure. The ESD diode is formed as a stripe in the center of an n+/n-well ring. This highly doped ring, together with a buried n-type layer, forms the cathode, 524, of the diode.

The diode is preferably formed on a p-type substrate, 504. An n-type buried layer, 508 and a p-well, 506, are implanted therein. An n-well, 510, is formed above the n-type buried layer, 508. The anode and cathode contacts of the diode are separated by shallow-trench isolations, 528. A p-type implant, 516, is shown forming the anode, 522, in the lower portion of the figure.

In both the upper and the lower portions of FIG. 5, a region 518 is illustrated wherein the p-well is shown separated from the n-type buried layer and from the n-well.

To be able to sustain a high diode breakdown voltage, the usual p-well implant in the inner, positively doped area of the device (i.e., the triple well area) is omitted. The buried n-type layer 508 is necessary to isolate the p+ anode from the surrounding p-well/p-substrate area.

To insure a high breakdown voltage between the cathode (n-well and the buried n-type layer) and the outer p-well, the distance between well implantations must be increased appropriately. A practical separation distance is 1-1.5 μm. Thus, high-voltage ESD diodes are formed with a p-well implant and an n-well/buried n-type layer suitably separated by an intervening substrate region.

A first preferred embodiment of an ESD diode comprises a single-stripe layout as shown in FIG. 5. A further preferred embodiment of an ESD diode comprises several stripes in which the active area regions in FIG. 5 abut each other, and the ESD diodes formed by these stripes are electrically connected in parallel to form a large diode with sufficient current-carrying capacity for an ESD event.

Figure 6:
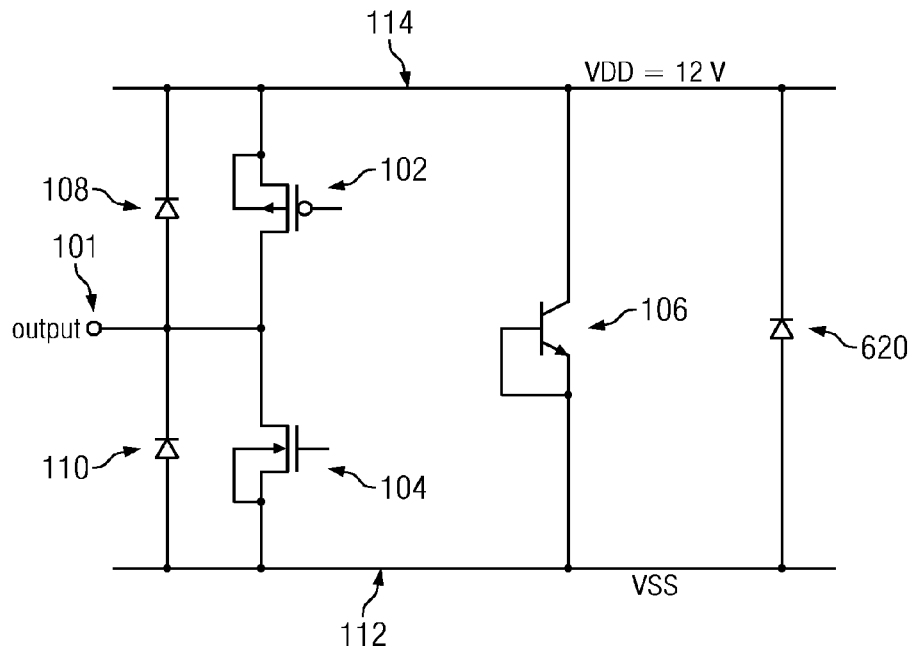
FIG. 6 illustrates an ESD protection circuit for a DEMOS device, formed with ESD diodes coupled to an output pad to be protected, an ESD power clamping device coupled to bias voltage supply rails, and an additional ESD diode coupled to the bias voltage supply rails, constructed according to an exemplary embodiment of the invention.

Turning now to FIG. 6, illustrated is an ESD protection circuit for an output pad 101 of a DEMOS device, constructed according to the principles of the invention. The circuit in FIG. 6 is similar to the circuit illustrated in FIG. 1, but now includes ESD diode 620 coupled between supply rails, 112 and 114. A diode is inherent in ESD power clamp 106, but exhibits limited forward current conduction capability, which must be considered for a positive ESD discharge into the lower voltage supply rail 112. The addition of ESD diode 620, which can be constructed in a manner similar to the ESD diode illustrated and described with reference to FIG. 5, is formed with sufficient reverse voltage capability that it does not break down during an ESD event wherein a positive ESD discharge is made into the upper voltage supply rail 114. Added ESD diode 620 provides robust circuit protection for an ESD event that raises the voltage of supply rail 112 above that of supply rail 114. The remaining elements in FIG. 6 and in the following figure with the same reference designations as those used in FIG. 1 are similar elements, and will not be redescribed in the interest of brevity.

Figure 7:
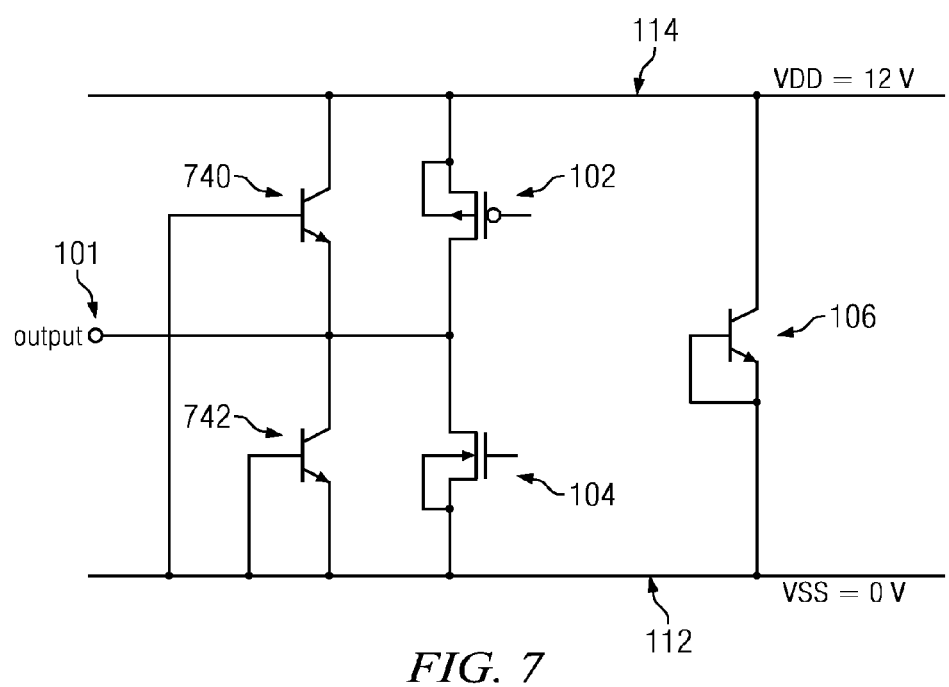
FIG. 7 illustrates an ESD protection circuit for a DEMOS device, formed with ESD power clamping devices coupled to an output pad to be protected, and a further ESD power clamping device coupled to bias voltage supply rails, constructed according to an exemplary embodiment of the invention.

Turning now to FIG. 7, illustrated is a further exemplary ESD protection circuit, constructed according to the principles of the invention. In the circuit illustrated in FIG. 7, ESD diodes 108 and 110, illustrated and described with reference to FIG. 1, are each replaced with a variant of the ESD power-clamping device that has been illustrated and described with reference to FIGS. 2 and 3. ESD power clamping devices 740 and 742, constructed in a manner similar to power clamping device 106, provide a robust level of ESD voltage clamping capability by replacing ESD diodes 108 and 110 in FIG. 1.

A further variant of the circuit illustrated in FIG. 7 can be constructed in accordance with the principles of the invention by adding an additional ESD diode coupled to the bias voltage supply rails, such as the added ESD diode 620, illustrated and described with reference to FIG. 6.

Figure 8:
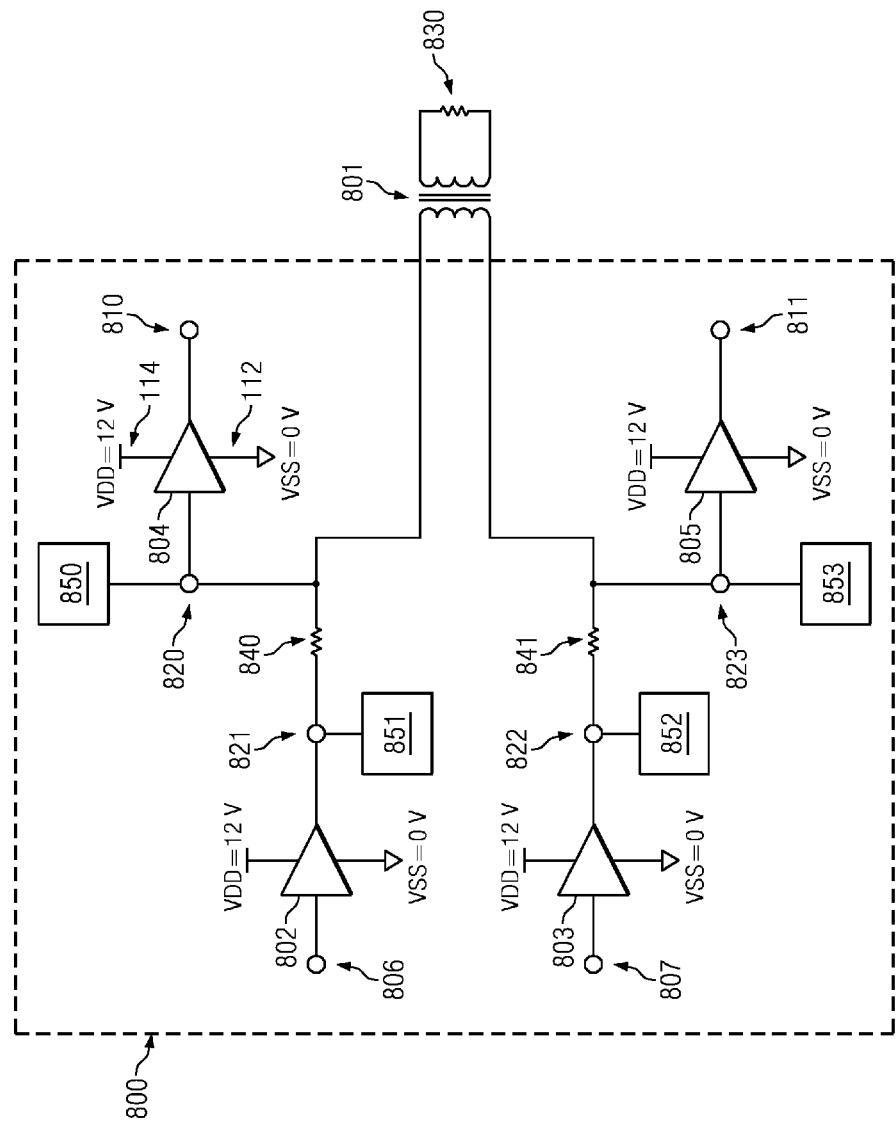
FIG. 8 illustrates a digital subscriber line (DSL) line-driver circuit including ESD protection for output nodes, constructed according to the principles of the invention.

Turning now to FIG. 8, illustrated is a digital subscriber line (DSL) line-driver circuit 800 formed as an integrated circuit, including ESD protection for output nodes, constructed according to the principles of the invention. The DSL line-driver circuit 800 is coupled to isolation and impedance-matching transformer 801 which is coupled in turn to a "twisted pair" subscriber line represented by resistor 830. Resistors 840 and 841 enable the impedance-matching function performed by transformer 801. Line amplifiers 802, 803, 804, and 805 are formed with fine-line semiconductor structures that require ESD protection for output nodes 820, 821, 822, and 823. The line amplifiers are coupled to bias voltage supply rails represented by VDD +12-volt voltage source 114, and VSS ground voltage source 112. A transmit signal from a balanced internal signal source (not shown) in the DSL line-driver circuit is coupled between internal circuit nodes 806 and 807 to transmitter line amplifiers 802 and 803. Duplex communication, i.e. simultaneous communication in both directions, is provided by transmitter line amplifiers 802 and 803 operating without interference with receiver line amplifiers 804 and 805, which are coupled to internal circuit nodes 810 and 811 and to output nodes 820 and 823. Each output node 820, 821, 822, and 823 is coupled, respectively, to ESD protection circuit 850, 851, 852, and 853. The ESD protection circuits are formed as illustrated and described hereinabove with reference to FIGS. 1, 6, and 7. Each ESD protection circuit is coupled to voltage source 114 and voltage source 112. The couplings of the ESD protection circuits to these voltage sources are not illustrated in FIG. 8, but are similar to those illustrated in FIGS. 1, 6, and 7. Thus, a DSL line-driver circuit is advantageously formed with ESD protection for its output nodes.

An ESD protection circuit has thus been introduced for an integrated circuit comprising a drain-extended MOS device. In accordance with one exemplary embodiment of the invention, the integrated circuit includes an output pad that requires ESD protection, and an ESD protection circuit therefor. The integrated circuit further includes bias voltage supply rails. The ESD protection circuit includes a first ESD diode coupled to the output pad and to one of the bias voltage supply rails, a second ESD diode coupled to the output pad and to another of the bias voltage supply rails, and an ESD power clamp coupled between the bias voltage supply rails. In an exemplary embodiment, the output pad is an output node of a DEMOS driver stage. To provide high diode reverse blocking voltage capability, the ESD diodes are formed with a lightly p-doped substrate region over a buried n-type layer, and a p-well implant and an n-well implant sufficiently separated by an intervening substrate region.

In a preferred embodiment, the ESD power clamp comprises a bipolar transistor, wherein a base and emitter thereof are coupled together. In a preferred embodiment, the bipolar transistor is an npn transistor. In a further preferred embodiment, the npn transistor comprises a vertical npn transistor. In further preferred embodiment, the collector of the npn transistor is formed using an n-well implantation and a DEMOS n-drain extension. In this manner, the ESD power clamp is formed so that it produces a snapback-based voltage-limiting characteristic. In a preferred embodiment, the ESD power clamp is formed in a double finger stripe layout.

In a further preferred embodiment, a third ESD diode is coupled to the bias voltage supply rails.

In a further preferred embodiment, the first ESD diode comprises an ESD power clamp. In a further preferred embodiment, the second ESD diode comprises an ESD power clamp formed as a vertical npn transistor with its collector coupled to the higher voltage bias voltage supply rail, i.e., the VDD bias voltage supply rail, its emitter coupled to the output pad, and its base coupled to the lower voltage bias voltage supply rail, i.e., the VSS bias voltage supply rail.

In a further preferred embodiment, a DSL line-driver circuit is formed as an integrated circuit including ESD protection elements for an output node as described herein.

Another exemplary embodiment of the invention provides a method of constructing an integrated circuit formed with a drain-extended MOS device and an output pad that requires ESD protection. In accordance with one exemplary embodiment, the integrated circuit includes bias voltage supply rails, wherein the higher voltage bias voltage supply rail is commonly referred to as the VDD rail, and the lower voltage bias voltage supply rail as the VSS rail. In an exemplary embodiment, the output pad is an output node of a DEMOS driver stage. In a preferred embodiment, the method includes coupling a first ESD diode to the output pad and to one of the bias voltage supply rails, a second ESD diode to the output pad and to another of the bias voltage supply rails, and an ESD power clamp between the bias voltage supply rails. In a preferred embodiment, the method includes forming the ESD diodes with a lightly p-doped substrate region over a buried n-type layer, and a p-well implant and an n-well implant sufficiently separated by an intervening substrate region, advantageously to provide high diode reverse blocking voltage capability.

In a preferred embodiment, the method includes forming the ESD power clamp as a bipolar transistor, and coupling a base and emitter thereof together. In a preferred embodiment, the method includes forming the bipolar transistor as an npn transistor. In a further preferred embodiment, the method further includes forming the npn transistor as a vertical npn transistor. In a further preferred embodiment, the method further includes forming the collector of the npn transistor with an n-well implantation and a DEMOS n-drain extension. In this manner, the ESD power clamp is formed so that it produces a snapback-based voltage-limiting characteristic. In a preferred embodiment, the method further includes forming the ESD power clamp in a double finger stripe layout.

In a further preferred embodiment, the method includes coupling a third ESD diode to the bias voltage supply rails, advantageously to provide higher current withstand capability. In a further preferred embodiment, the method includes forming the first and second ESD diodes each as an ESD power clamp.

In a further preferred embodiment, the method includes forming the first ESD diode with an ESD power clamp. In a further preferred embodiment, the method includes forming the second ESD diode with an ESD power clamp as a vertical npn transistor, with its collector coupled to the higher voltage bias voltage supply rail, i.e., the VDD bias voltage supply rail, its emitter coupled to the output pad, and its base coupled to the lower voltage bias voltage supply rail, i.e., the VSS bias voltage supply rail.

Although an ESD protection circuit and related method have been described for application to a DEMOS device, it should be understood that other applications of an ESD protection circuit are contemplated within the broad scope of the invention, and need not be limited to DEMOS devices.

Although the invention has been shown and described primarily in connection with specific exemplary embodiments, it should be understood by those skilled in the art that diverse changes in the configuration and the details thereof can be made without departing from the essence and scope of the invention as defined by the claims below. For example, and without limitation, an integrated circuit formed without a DEMOS device is contemplated within the broad scope of the invention. The scope of the invention is therefore determined by the appended claims, and the intention is for all alterations that lie within the range of the meaning and the range of equivalence of the claims to be encompassed by the claims.

What is claimed is:

1. An integrated circuit, comprising:
    an output pad;
    a first bias voltage supply rail;
    a second bias voltage supply rail;
    a first ESD diode coupled to said output pad and to one of said first bias voltage supply rail or second bias voltage supply rail;
    a second ESD diode coupled to said output pad and to another of said first bias voltage supply rail or second bias voltage supply rail; and
    an ESD power clamp coupled between said first bias voltage supply rail and second bias voltage supply rail, said ESD power clamp comprising an npn transistor having a base and an emitter, wherein
        the base and the emitter of said npn transistor are electrically coupled together,
        the base of said npn transistor comprises a p-well implant and a first lightly doped p-type substrate region disposed directly adjacent to the p-well implant, and
        a collector of said npn transistor comprises
            a lightly doped n-type region disposed directly adjacent to the first lightly doped p-type substrate region, the lightly doped n-type region separated from the p-well implant by a first distance,
            an n-well region disposed directly adjacent to the lightly doped n-type region, the n-well region comprising an n-well implant, and
            an n-type buried layer disposed directly beneath the n-well region, the lightly doped n-type region and at least a portion of the first lightly doped p-type substrate region, wherein the n-type buried layer comprises a buried layer implantation, the n-type buried layer is not disposed directly beneath the p-well implant, and the first lightly doped p-type substrate region forms a contiguous region.

2. The integrated circuit as claimed in claim 1, wherein said integrated circuit comprises a drain-extended MOS device.

3. The integrated circuit as claimed in claim 1, wherein said npn transistor comprises a vertical npn transistor.

4. The integrated circuit as claimed in claim 1, wherein said ESD power clamp is constructed to produce a snapback-based voltage-limiting characteristic.

5. The integrated circuit as claimed in claim 1, further including a third ESD diode coupled to said first bias voltage supply rail and second voltage supply rail.

6. The integrated circuit as claimed in claim 1, wherein said first bias voltage supply rail comprises a VDD bias voltage supply rail and said second bias voltage supply rail comprises a VSS bias voltage supply rail, and wherein said second ESD diode comprises a vertical npn transistor with a collector coupled to said VDD bias voltage supply rail, an emitter coupled to said output pad, and a base coupled to said VSS bias voltage supply rail.

7. The integrated circuit as claimed in claim 1, wherein said output pad is an output node of a DEMOS driver stage.

8. The integrated circuit as claimed in claim 1, wherein said ESD power clamp is formed in a double finger stripe layout.

9. The integrated circuit as claimed in claim 1, wherein said first ESD diode and second ESD diode comprise a second lightly p-doped substrate region over a buried n-type layer, and a further p-well implant and a further n-well implant separated by an intervening substrate region.

10. The integrated circuit of claim 1, wherein the first and second ESD diodes comprise:
    a second n-type buried layer disposed within a further p-type substrate region;
    a second n-well region disposed over a first portion of the second n-type buried layer;
    a first highly doped n-type region disposed above the second n-well region; and
    a second highly doped p-type region disposed over a second portion of the second n-type buried layer, the second portion of the second n-type buried layer adjacent to the first portion of the second n-type buried layer.

11. A DSL (digital subscriber line) line-driver integrated circuit, comprising:
    a line amplifier coupled to an output pad;
    a first bias voltage supply rail;
    a second bias voltage supply rail;
    a first ESD diode coupled to said output pad and to one of said first bias voltage supply rail or second bias voltage supply rail;
    a second ESD diode coupled to said output pad and to another of said first bias voltage supply rail or second bias voltage supply rail; and
    an ESD power clamp coupled between said first bias voltage supply rail and second bias voltage supply rail, said ESD power clamp comprising an npn transistor, wherein a base and an emitter of said npn transistor are electrically coupled together, and wherein the base of said npn transistor comprises a p-well implant and a lightly doped p-type substrate region disposed directly adjacent to the p-well implant, and a collector of said npn transistor comprises a lightly doped n-type region disposed directly adjacent to the lightly doped p-type substrate region, the lightly doped n-type region separated from the p-well implant by a first distance, an n-well region disposed directly adjacent to the lightly doped n-type region, the n-well region comprising an n-well implant, and an n-type buried layer disposed directly beneath the n-well region, the lightly doped n-type region and at least a portion of the lightly doped p-type substrate region, wherein the n-type buried layer comprises a buried layer implantation, the n-type buried layer is not disposed directly beneath the p-well implant and the lightly doped p-type substrate region forms a contiguous region.

12. The DSL line-driver integrated circuit as claimed in claim 11, wherein said line amplifier is a receiver line amplifier.

13. The DSL line-driver integrated circuit as claimed in claim 11, further including a transmitter line amplifier.

14. The DSL line-driver integrated circuit as claimed in claim 11, wherein said DSL line-driver integrated circuit provides duplex operation.

15. An integrated circuit comprising an ESD power clamp, the ESD power clamp comprising:

a lightly doped p-type semiconductor substrate;

a collector region comprising an n-type buried layer disposed within the lightly doped p-type semiconductor substrate, the n-type buried layer comprising a buried layer implantation, an n-well within the lightly doped p-type semiconductor substrate, the n-well disposed above the n-type buried layer, the n-well comprising an n-well implant, a first highly doped n-type region disposed above the n-well, the first highly doped n-type region forming a collector, and a lightly doped n-type region disposed completely above the n-type buried layer, the lightly doped n-type region disposed next to the n-well, wherein a portion of the lightly doped p-type semiconductor substrate disposed next to the lightly doped n-type region is disposed directly over a portion of the n-type buried layer;

a base region comprising a p-well adjacent to the lightly doped n-type region, the p-well separated from the lightly doped n-type region by a first region of the lightly doped p-type semiconductor substrate having a first width, wherein the p-well comprises a p-well implant, the lightly doped n-type region forms a pn junction with the first region of the lightly doped p-type semiconductor substrate, the p-well directly physically contacts the first region of the lightly doped p-type semiconductor substrate, and the p-well is not disposed directly above the n-type buried layer, a highly doped p-type region disposed above the p-well, the highly doped p-type region forming a base; and an emitter region comprising a second highly doped n-type region disposed above the first region of the lightly doped p-type semiconductor substrate, wherein the second highly doped n-type region forms an emitter and the first region of the lightly doped p-type semiconductor substrate forms a contiguous region.

16. The integrated circuit of claim 15, wherein the collector region, the base region and the emitter region form a first bipolar transistor.

* * * * *